(12) United States Patent
Kim

(10) Patent No.: US 6,700,647 B2
(45) Date of Patent: Mar. 2, 2004

(54) EXPOSURE SYSTEM OF SEMICONDUCTOR WAFER AND METHOD FOR OPERATING THE SAME

(75) Inventor: Jin-muk Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 10/158,501

(22) Filed: May 30, 2002

(65) Prior Publication Data

US 2003/0048429 A1 Mar. 13, 2003

(30) Foreign Application Priority Data

Sep. 7, 2001 (KR) ........................................ 2001-55065

(51) Int. Cl.[7] ........................ G03B 27/72; G03B 27/42; G03B 27/54
(52) U.S. Cl. ............................ 355/71; 355/53; 355/67; 355/69
(58) Field of Search ........................... 355/53, 67, 68, 355/69, 71; 396/463–501; 430/30

(56) References Cited

U.S. PATENT DOCUMENTS 6,211,944 B1 * 4/2001 Shiraishi ...................... 355/53
6,462,807 B1 * 10/2002 Nishi ........................... 355/53
2002/0186358 A1 * 12/2002 Toprac et al. ................. 355/53

* cited by examiner

*Primary Examiner*—Alan Mathews
(74) *Attorney, Agent, or Firm*—F. Chau & Associates LLC

(57) ABSTRACT

An exposure system of a semiconductor wafer and a method for operating the same capable of preventing defects in a photolithographic process. The exposure system of a semiconductor wafer comprises first and second shutters for opening or closing a light source, first and second sensing circuits for sensing the positions of the first and second shutters to generate first and second sensed signals, a controller for determining whether the first and second shutters are completely opened in response to the first and second sensed signals and for generating a control signal when the first and second shutters are not completely opened.

39 Claims, 10 Drawing Sheets

EXPOSURE SYSTEM OF SEMICONDUCTOR WAFER AND METHOD FOR OPERATING THE SAME

CROSS-REFERENCE TO RELATED APPLICATION

This application claims priority to Korean Patent Application No. 2001-55065 filed on Sep. 7, 2001.

BACKGROUND

1. Technical Field

The present invention relates to an exposure system of a semiconductor wafer and a method for operating the same, and more particularly, to an exposure system of a semiconductor wafer which determines whether a shutter for shutting a light source is fully opened or closed to prevent defects in a photolithographic process.

2. Description of Related Art

A photolithographic process in manufacturing a semiconductor device comprises an exposure process in which a pattern shape of a reticle having predetermined patterns is transferred to a photoresist layer. There are exposure apparatuses such as an aligner for exposing the entire surface of a wafer or a stepper for exposing a partially divided wafer. An exposure apparatus comprises a shutter that controls the transfer of a proper amount of light from an exposure source to a photoresist layer at desired times.

FIG. 1 shows a conventional exposure apparatus of a semiconductor wafer. Referring to FIG. 1, the conventional exposure apparatus comprises a light source 10 and a stage 50 for seating a wafer 60. The light radiated from the light source 10 is transferred to the wafer 60. The apparatus further comprises a shutter 20 for selectively closing off light radiated from the light source 10, a reticle 30 having patterns to be transferred to the surface of the wafer 60, and a lens assembly 40 for reducing and projecting the shape of the reticle 30.

The shutter 20, as shown in FIG. 2A, comprises a pair of shutters, i.e., a first shutter 22 and a second shutter 24 to rapidly open and close the light source 10. The first and second shutters 22 and 24 are opened and closed based on operation of first and second cylinders 26 and 28. FIGS. 2A–2C respectively illustrate a standby state, an open state and a closed state of the first and second shutters 22 and 24.

When the light source 10 is opened, as shown in FIG. 2B, air is supplied to the second cylinder 28 of the second shutter 24 and thus, the second shutter 24 is opened. In such a case, the first shutter 22 is at the standby state.

When the light source 10 is closed, as shown in FIG. 2C, the first and second shutters 22 and 24 are simultaneously closed. Since it is faster to simultaneously drive the first and second shutters 22 and 24 than it is to drive only the second shutter 24, the first and second shutters 22 and 24 are simultaneously driven to rapidly close the light source 10. After that, the first shutter 22 is returned to an initial position, i.e., the standby state, as shown in FIG. 2A. Typically, the light source 10 is opened and closed by the second shutter 24, and the first shutter 22 is driven only to rapidly close the light source 10.

However, when the first and second cylinders 26 and 28 for driving the shutter 20 are worn or damaged, or when there is damage of an air line for supplying air to the first and second cylinders 26 and 28, or when bearings for supporting the first and second cylinders 26 and 28 are worn, the shutter 20 may not be fully exposed or closed. Consequently, the light source may not be completely closed or opened as required.

For example, if the shutter 20 is not completely opened during an exposure process, the quantity of transferred light is reduced. Thus, it would be difficult to form a photoresist pattern having a desired shape. If the shutter 20 is not completely closed, a photolithographic process is performed in a state where light leaks from the light source 10. In such a case, either a photoresist pattern having an undesired shape is formed or no photoresist pattern is formed.

SUMMARY OF THE INVENTION

To solve the above problems, it is an object of the present invention to provide an exposure system of a semiconductor wafer which determines whether a shutter for shutting a light source is completely opened to prevent defects in a photolithographic process.

It is another object of the present invention to provide an exposure system of a semiconductor wafer which checks whether a shutter for shutting a light source is completely closed to prevent defects in a photolithographic process.

It is a further object of the present invention to provide a method for operating the exposure system of a semiconductor wafer.

According to one aspect of the present invention, an exposure system of a semiconductor wafer comprises first and second shutters for opening or closing a light source, a first sensing circuit for sensing a position of the first shutter and for generating a first sensed signal, a second sensing circuit for sensing a position of the second shutter and for generating a second sensed signal, and a controller for determining whether the first and second shutters are completely opened in response to the first and second sensed signals and for generating a control signal when either the first shutter or the second shutter is not completely opened.

According to another aspect of the present invention, a method for operating an exposure system of a semiconductor wafer, the exposure system comprising first and second shutters for closing or opening a light source and first and second cylinders for driving the first and second shutters, the first and second cylinders comprising magnets, is provided. The method comprises the steps of sensing positions of the first and second shutters and generating first and second sensed signals, determining whether the first and second shutters are completely opened, in response to the first and second sensed signals, and performing a warning operation when the first and second shutters are not completely opened, thereby turning off the exposure system.

According to another aspect of the present invention, an exposure system of a semiconductor wafer comprises first and second shutters for selectively opening or closing a light source, a first sensing circuit for sensing the extent of a closed state of the first shutter and for generating a first sensed signal, a second sensing circuit for sensing the extent of an opened state of the first shutter and for generating a second sensed signal, a third sensing circuit for sensing the extent of a closed state of a second shutter and for generating a third sensed signal, a fourth sensing circuit for sensing the extent of an opened state of the second shutter and for generating a fourth sensed signal, and a controller for determining whether the first and second shutters are completely opened or closed, in response to the first through the fourth sensed signals and for generating a control signal when either the first shutter or the second shutter is not completely opened or closed.

According to further aspect of the present invention, a method for operating an exposure system of a semiconductor wafer, the exposure system comprising first and second shutters for closing or opening a light source and first and second cylinders for driving the first and second shutters, the first and second cylinders comprising magnets, is provided. The method comprises the steps of sensing the extent of a closed state of the first shutter to generate a first sensed signal, sensing the extent of an opened state of the first shutter to generate a second sensed signal, sensing the extent of a closed state of the second shutter to generate a third sensed signal, sensing the extent of an opened state of the second shutters to generate a fourth sensed signal, determining whether the first and second shutters are completely opened, in response to the first through fourth sensed signals, and performing a warning operation when the first and second shutters are not completely opened or closed, thereby turning off the exposure system.

These and other aspects, features, and advantages of the present invention will become apparent from the following detailed description of preferred embodiments, which is to be read in conjunction with the accompanying figures.

DETAILED DESCRIPTION OF PREFERRED EMBODIMENTS

Figure 1:
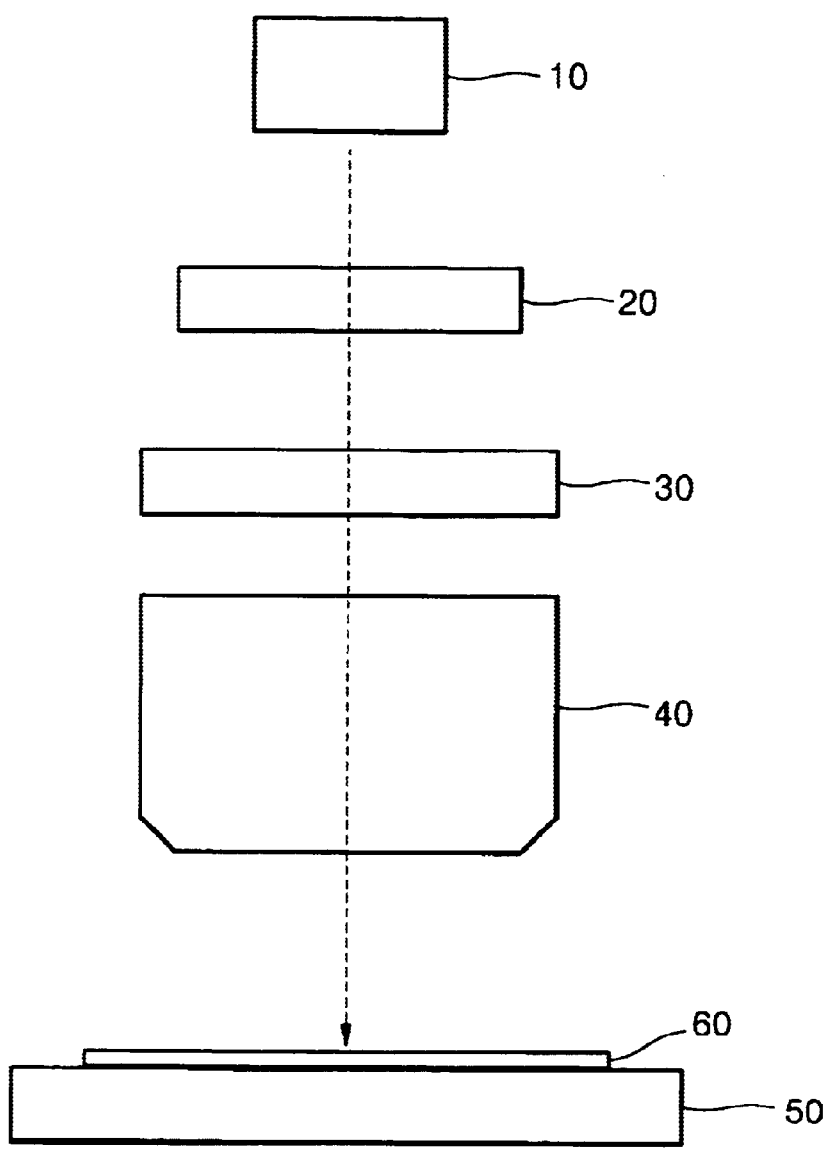
FIG. 1 is a schematic view of a conventional exposure apparatus of a semiconductor wafer.
Figure 2A:
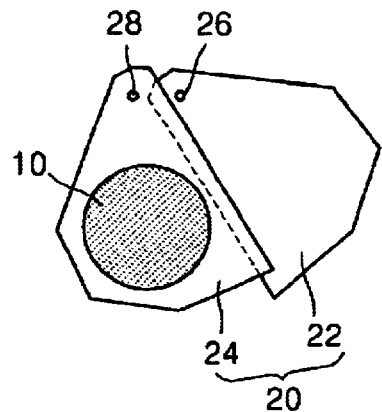
FIGS. 2A–2C are diagrams schematically illustrating the operations of shutters of the conventional exposure apparatus of FIG. 1.
Figure 2B:
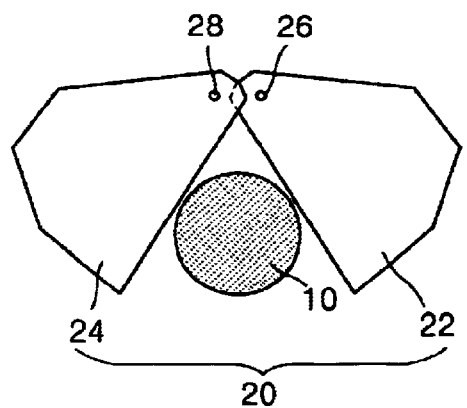
Figure 2C:
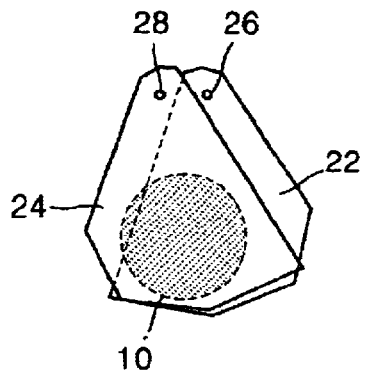

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be through and complete, and will fully convey the scope of the invention to those skilled in the art. In the drawings, the forms of elements are exaggerated for clarity. Like reference numerals refer to like elements throughout the drawings. It will be understood that when a layer is referred to as being on another layer or on a semiconductor substrate, it can be directly on the other layer or on the semiconductor substrate, or intervening layers may also be present.

Figure 3:
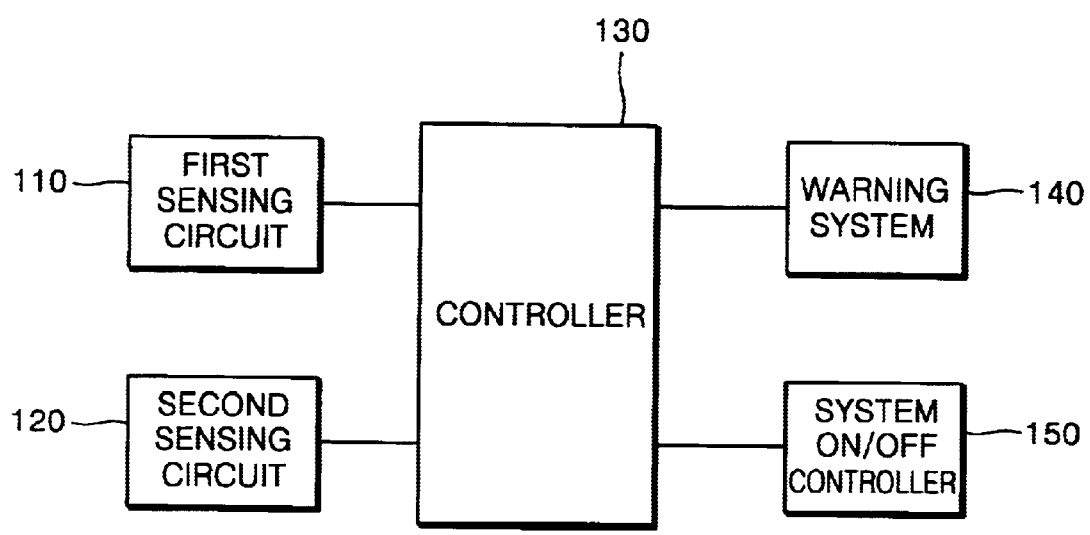
FIG. 3 is a block diagram of an exposure system of a semiconductor wafer according to an embodiment of the present invention.
Figure 4:
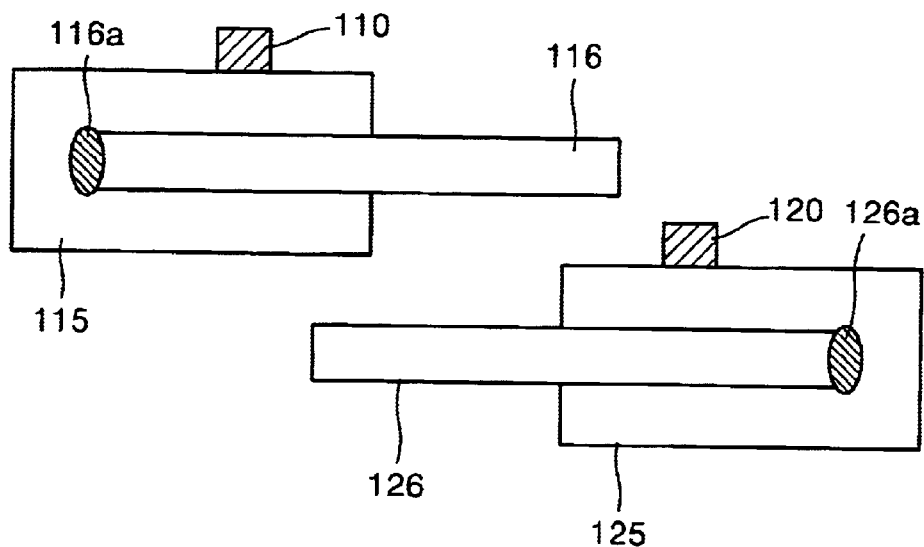
FIG. 4 is a schematic view of shutters of the exposure system of FIG. 3.

Referring to FIGS. 3 and 4, an exposure system of a semiconductor wafer according to an embodiment of the present invention comprises first and second sensing circuits 110 and 120 for sensing the positions of first and second shutters 115 and 125. The first and second sensing circuits 110 and 120 sense operation of first and second cylinders 116 and 126 for driving the first and second shutters 115 and 125, for instance, the positions of magnets 116a and 126a of the first and second cylinders 116 and 126. The first and second cylinders 116 and 126 are operated by air.

Each of the first and second magnets 116a and 126a is positioned at one end of each of the first and second cylinders 116 and 126, and is moved according to operation of the first and second cylinders 116 and 126. Since the first and second sensing circuits 110 and 120 sense the first and second cylinders 116 and 126 (which drive the first and second shutters 115 and 125) by sensing the movement of the first and second magnets 116a and 126a thereof, the sensing circuits 110 and 120 easily sense the positions of the first and second shutters 115 and 125.

The exposure system of a semiconductor wafer further comprises a controller 130, a warning system 140 and a system on/off controller 150. The controller determines whether the first or second shutter 115 or 125 is completely opened or closed in response to signals generated by the first and second sensing circuits 110 and 120, and outputs a control signal to the system on/off controller 150 to stop the operation of the exposure system if the first or second shutter 115 or 125 is not completely opened or closed. The system on/off controller 150 turns on/off the exposure system. The warning system 140 operates when the first or second shutter 115 or 125 is not completely opened or closed. The warning system 140 may comprise an alarm or a warning lamp.

Figure 5:
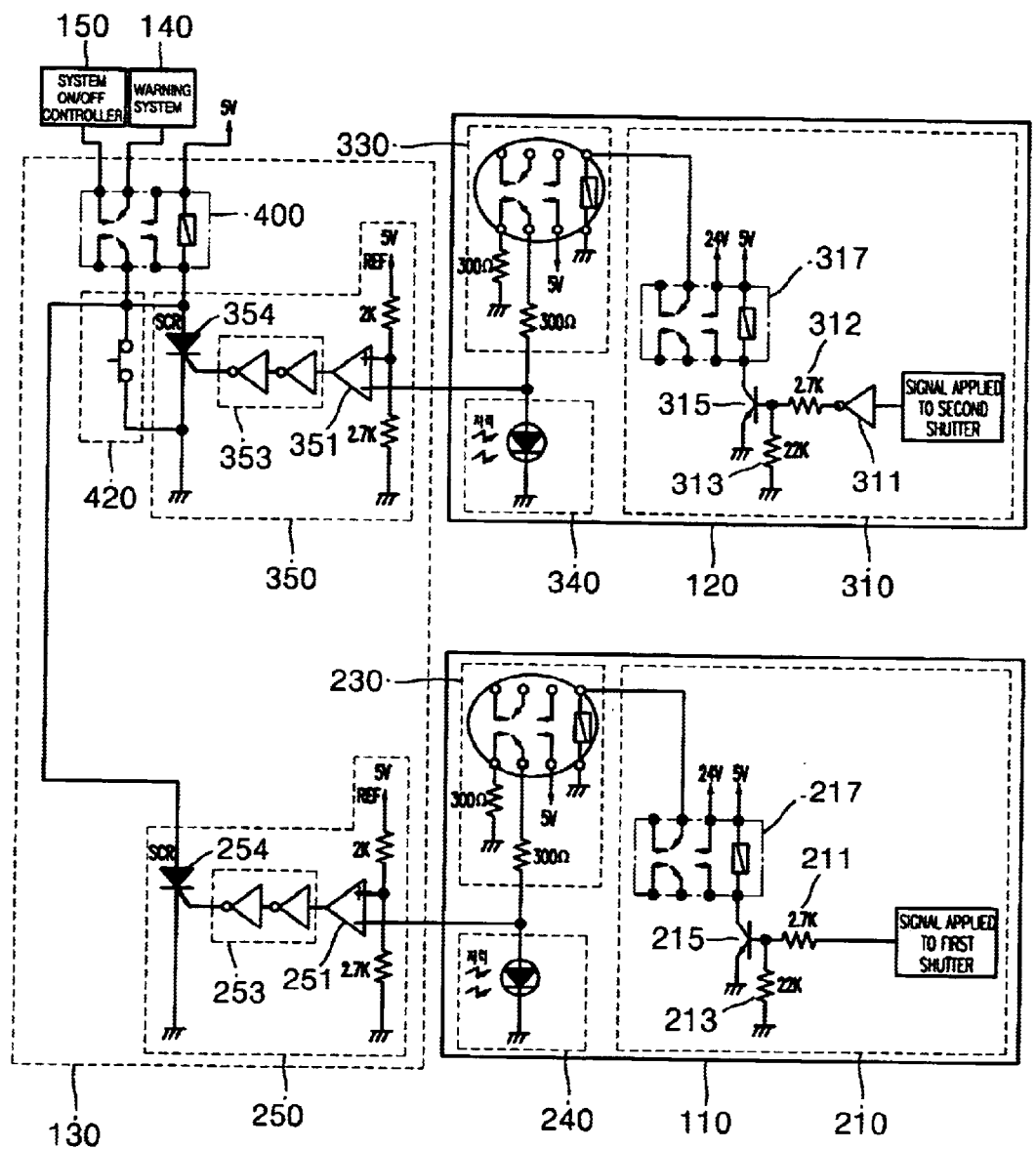
FIG. 5 is a circuit diagram of the exposure system of FIG. 3, according to an embodiment of the present invention.
Figure 6:
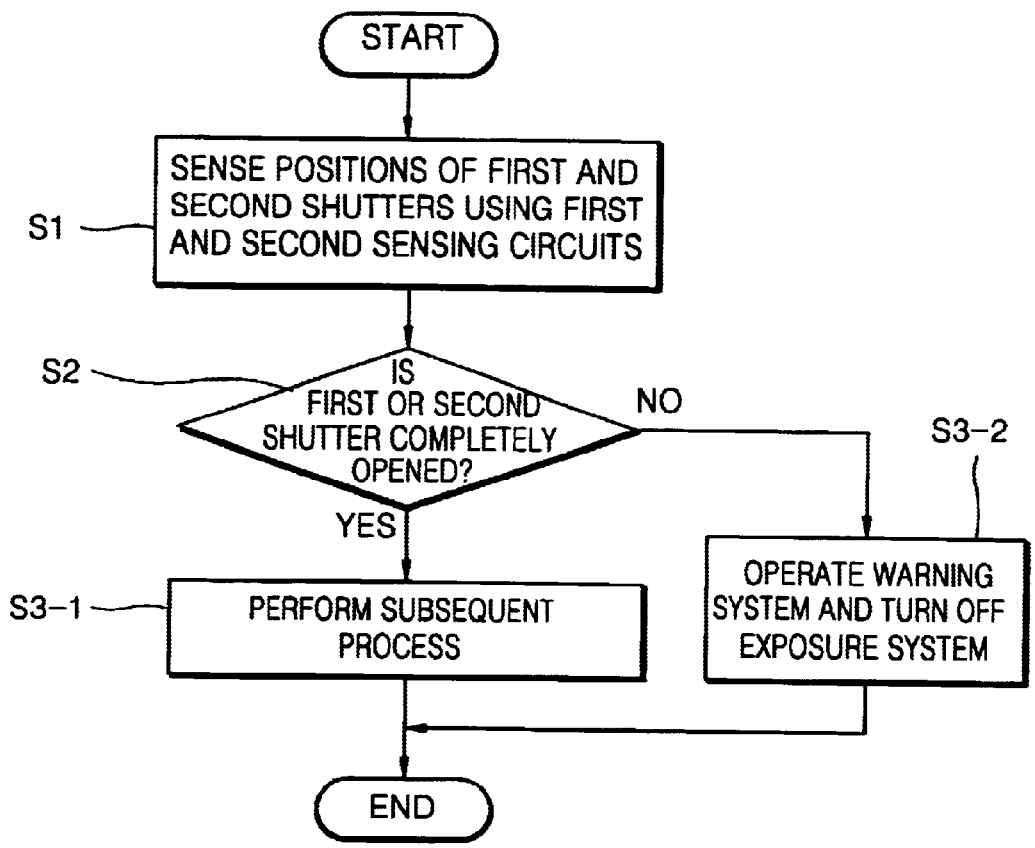
FIG. 6 is a flow chart illustrating a preferred mode of operation of the exposure system of the FIG. 3.

FIG. 5 shows an exemplary circuit of the exposure system of FIG. 3. The first sensing circuit 110 comprises an input circuit 210 for receiving an input signal for opening or closing the first shutter 115, a timer 230 for delaying the input signal by a predetermined time, and a sensor 240 for sensing a circumferential magnetic field in response to the delayed signal transferred from the timer 230.

The input circuit 210 of the first sensing circuit 110 comprises first and second resistors 211 and 213 for attenuating a voltage of the input signal to a voltage suitable for an internal circuit, and switching elements that is selectively activated according to the attenuated signal. The switching elements, for example, comprise a bipolar transistor 215 and a relay 217 in which the relay 217 activates in response to the activation of the bipolar transistor 215.

The timer 230 of the first sensing circuit 110 delays the input signal by a predetermined time, i.e., a time for moving the first magnet 116a of the first cylinder 116 in response to the input signal for driving the first shutter 115.

The sensor 240 of the first sensing circuit 110 senses the circumferential magnetic field, that is, the position of the first magnet 116a of the first cylinder 116, in response to the delayed input signal output from the timer 230. The sensor 240 may comprise a diode.

The second sensing circuit 120 comprises similar components to those of the first sensing circuit 110. For instance, the second sensing circuit 120 comprises an input circuit 310 for receiving an input signal for opening or closing the second shutter 125, a timer 330 for delaying the input signal by a predetermined time, and a sensor 340 for sensing a circumferential magnetic field in response to the input signal transferred from the timer 330.

The input circuit 310 of the second sensing circuit 120 comprises an inverter 311 for inverting the input signal, first and second resistors 312 and 313 for attenuating a voltage of the input signal to a predetermined voltage, and switching elements that is selectively activated according to the attenuated signal. The switching elements, for example, comprise a bipolar transistor 315 and a relay 317 in which the relay 317 activates in response to the activation of the bipolar transistor 315.

The timer 330 of the second sensing circuit 120 delays the input signal by a predetermined time, i.e., a time for moving the second magnet 126a of the second cylinder 126 in response to the input signal for driving the second shutter 125.

The sensor 340 of the second sensing circuit 120 senses the circumferential magnetic field, that is, the position of the second magnet 126a of the second cylinder 126 in response to the delayed input signal outputted from the timer 330.

The controller 130 comprises first and second circuits 250 and 350 for processing the signals sensed by the first and second sensing circuits 110 and 120 and an output circuit 400 for selectively outputting a control signal based on the processing results of the first and second circuits 250 and 350. The controller 130 may further comprise a reset circuit 420 for initializing the first and second circuits 250 and 350.

The first and second circuits 250 and 350 respectively comprise amplifiers 251 and 351 for comparing the sensed signals from the first and second sensing circuits 110 and 120 with a reference voltage REF and for amplifying the compared signals, buffers 253 and 353 for buffering the amplified signals output from the amplifiers 251 and 351, and switching elements 254 and 354, for example, silicon controller rectifiers (SCRs) selectively activated based on the output signals of the buffers 253 and 353.

The amplifiers 251 and 351 may comprise operational amplifiers (OP amps), and compare the output voltages of the sensors 240 and 340 of the first and second sensing circuits 110 and 120 with the reference voltage REF. The amplifiers 251 and 351 output a "low" signal when the output voltages of the sensors 240 and 340 are less than the reference voltage REF, and output a "high" signal when the output voltages of the sensors 240 and 340 are greater than the reference voltage REF.

The buffers 253 and 353, buffering the signals outputted from the amplifiers 251 and 351, may comprise a plurality of serial inverters. The output signals of the buffers 253 and 353 are inputted into the switching elements 254 and 354, and the switching elements 254 and 354 are activated in response to the "high" signals outputted from the buffers 253 and 353.

The switching elements 254 and 354, i.e., the SCRs hold the signals outputted from the buffers 253 and 353 until they receive next signals from the buffers 253 and 353. A transistor may be used as a switching element instead of the SCRs. However, since the transistor cannot maintain the output signal of the buffers 253 and 353 until a next signal is applied from the buffers 253 and 353 to the transistor, the SCR may be properly used as switching elements in the embodiment.

The output circuit 400 comprises a relay and outputs a control signal to the warning system 140 and the system on/off controller 150 when the SCR 254 or 354 of the first or second circuits 250 or 350 is activated.

The reset circuit 420 resets the signals stored in the SCRs 254 and 354.

Resistors, described in FIG. 5, are to attenuate the voltages of signals inputted to the resistors to the voltages suitable for corresponding circuits.

Referring to FIGS. 3~6, the operation of the exposure system of a semiconductor wafer according to one embodiment of the present invention will be described hereinafter. Here, an open state indicates that the first shutter 115 is not driven and the second shutter 125 is driven. A light source is opened when a "high" signal is applied to the first shutter 115 (that is not driven) and a "low" signal is applied to the second shutter 125 (that is driven).

The first and second sensing circuits 110 and 120 sense the positions of the first and second shutters 115 and 125 (S1).

For example, when a "high" signal is applied to the first shutter 115 to stop the operation of the first shutter 115, the bipolar transistor 215 of the input circuit 210 is turned on. In response to the activation of the bipolar transistor 215, the relay 217 is activated, and thus, the timer 230 operates. The first cylinder 116 of the first shutter 115 is driven in response to the signal applied to the first shutter 115, and thus, the first magnet 116a at one end of the first cylinder 116 begins to move. The timer 230 delays the "high" signal until the first magnet 116a arrives at the other end of the first cylinder 116. The sensor 240 senses a circumferential magnetic field in response to the signal output from the timer 230.

When a "low" signal is applied to the second shutter 125, the "low" signal is inverted by the inverter 311, and thus, the bipolar transistor 315 is activated in response to the inverted signal. In response to the activation of the bipolar transistor 315 of the input circuit 310, the relay 317 is activated, and thus, the timer 330 operates. The second cylinder 126 of the second shutter 125 is driven in response to the "low" signal applied to the second shutter 125, and thus, the second magnet 126a at one end of the second cylinder 126 begins to move. The timer 330 delays the "low" signal until the second magnet 126a arrives at the other end of the second cylinder 126. The sensor 340 of the second sensing circuit 120 senses a circumferential magnetic field in response to the signal output from the timer 330.

The signals generated by the first and second sensing circuits 110 and 120 are compared with a reference voltage to determine whether the first or second shutters is completely opened (S2).

For instance, when the sensors 240 and 340 sense the magnetic fields, the turn-on voltages of diodes (0.7V in case of silicon) are applied to the sensors 240 and 340, and thus, the sensors 240 and 340 comprising diodes are turned on. The turn-on voltages of diode are applied to positive input terminals of the amplifiers 251 and 351, and the reference voltage REF is applied to negative input terminals of the amplifiers 251 and 351. Since the turn-on voltages of diodes are less than the reference voltage REF, the amplifiers 251 and 351 output "low" signals. The output signals of the amplifiers 251 and 351 are applied to the SCRs 254 and 354 through the buffers 253 and 353. Since the signals output from the amplifiers 251 and 351 are "low", the SCRs 254 and 354 are turned off, and thus, the output circuit 400 comprising the relay is not activated. Because the output circuit 400 is not activated, it is determined that the second shutter 126 is completely opened, a subsequent process is performed (S3-1).

Meanwhile, when one of the sensors 240 and 340 of the first and second sensing circuits 110 and 120 does not sense a magnetic field, the output signal of the timer 230 or 330 is applied to the positive input terminal of the amplifier 251 or 351. The reference voltage REF is applied to the negative input terminals of the amplifiers 251 and 351. Because both of the output signal of the timer 230 or 330 and the reference voltage REF are "high", the amplifier 251 or 351 outputs a "high" signal. The buffer 251 or 351 buffers the output signal of the amplifier 251 or 351, and the SCR 254 or 354 is activated in response to the buffered signal. In response to the activation of the SCR 254 or 354, the output circuit 400 operates, and the warning system 140 operates. Thus, a control signal is applied to the system on/off controller 150 to turn off the exposure system (S3-2).

Advantageously, the exposure system of a semiconductor device according to an embodiment of the present invention determines whether the second shutter (which is usually driven to open/close the exposure system) is completely opened. Because the warning system is activated to turn off the exposure system when the second shutter is not completely opened, the defects in a photolithographic process are prevented.

Figure 7:
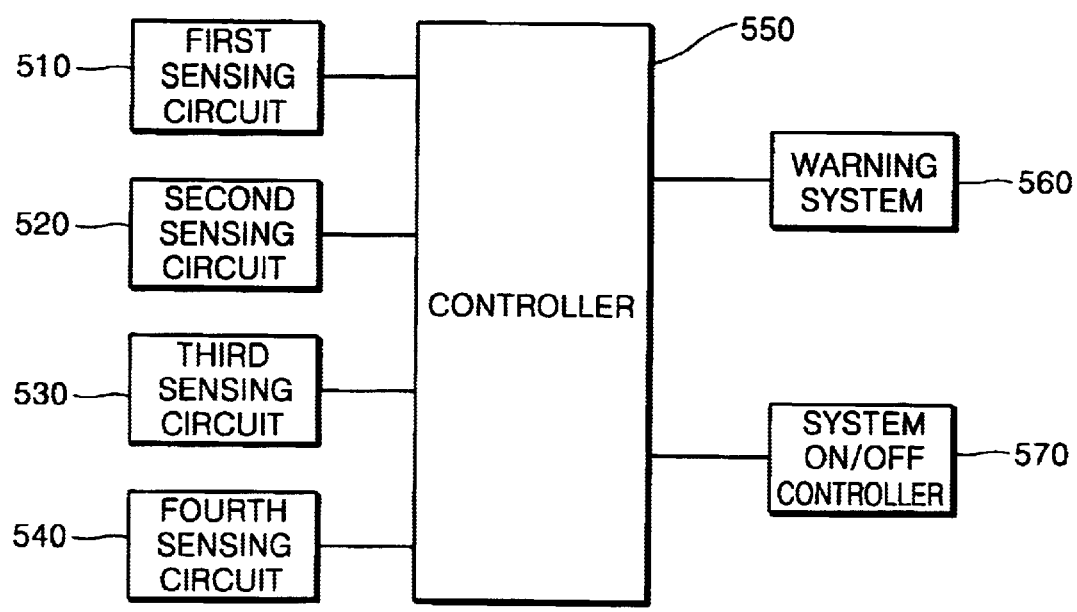
FIG. 7 is a block diagram of an exposure system of a semiconductor wafer according to another embodiment of the present invention.
Figure 8:
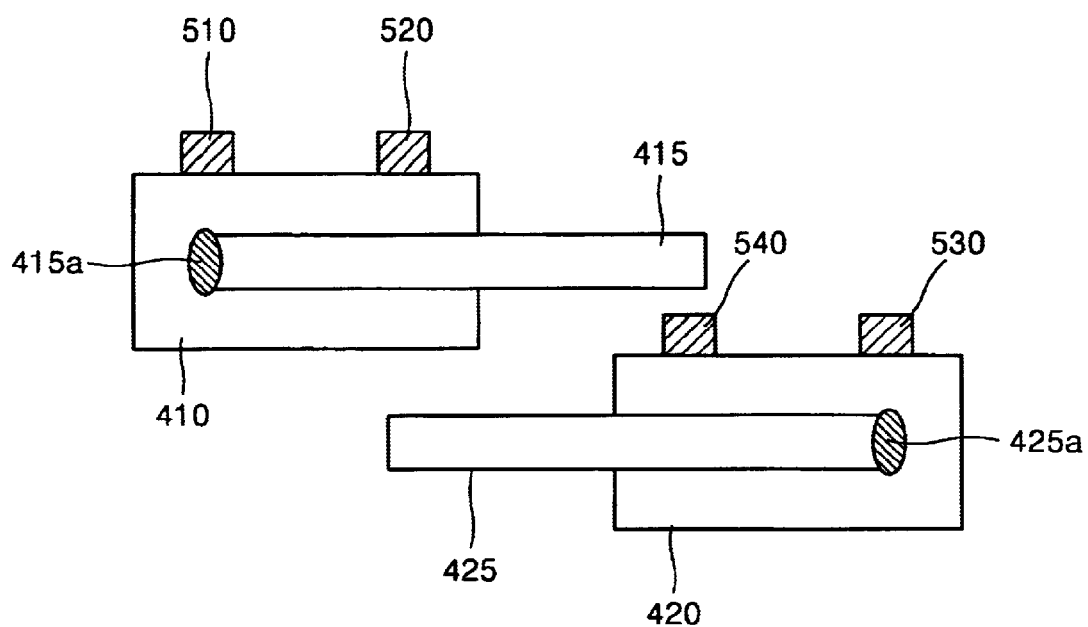
FIG. 8 is a schematic view of shutters of the exposure system of FIG. 7.

FIG. 7 is a block diagram of an exposure system of a semiconductor wafer according to another embodiment of the present invention. FIG. 8 is a schematic view of shutters of the exposure system of FIG. 7. An exposure system of a semiconductor wafer according to another embodiment of the present invention comprises first, second, third, and fourth sensing circuits 510, 520, 530, and 540 for sensing the extent of opened/closed states of first and second shutters 410 and 420 for shutting a light source. Similar to the first and second sensing circuits 110 and 120 of FIG. 3, the first and second sensing circuits 410 and 420 are driven by first and second cylinders 415 and 425 (which are operated by air) comprising first and second magnets 415a and 425a. Each of the first and second magnets 415a and 425a is installed at one end of each of the first and second cylinders 415 and 425 and moves based on the movement of the first and second cylinders 415 and 425.

The first sensing circuit 510 detects the extent of a closed state of the first shutter 410, the second sensing circuit 520 detects the extent of an opened state of the first shutter 410, the third sensing circuit 530 detects the extent of a closed state of the second shutter 420, and the fourth sensing circuit 540 detects the extent of an opened state of the second shutter 420. Each of the first through fourth sensing circuits 510, 520, 530, and 540 comprises a sensor for sensing the position of the first and second cylinders 415 or 425.

The exposure system of FIG. 7 further comprises a controller 550, a warning system 560 and a system on/off controller 570. The controller 550 determines whether the first or second shutter 410 or 420 is completely opened or closed, based on the signals generated by the first through fourth sensing circuits 510, 520, 530, and 540. The controller 550 outputs a control signal to the system on/off controller 570 to stop the operation of the exposure system when the first or second shutter 410 or 420 is not completely opened or closed.

The warning system 560 operates when the first or second shutter 410 or 420 is not completely opened.

Figure 9:
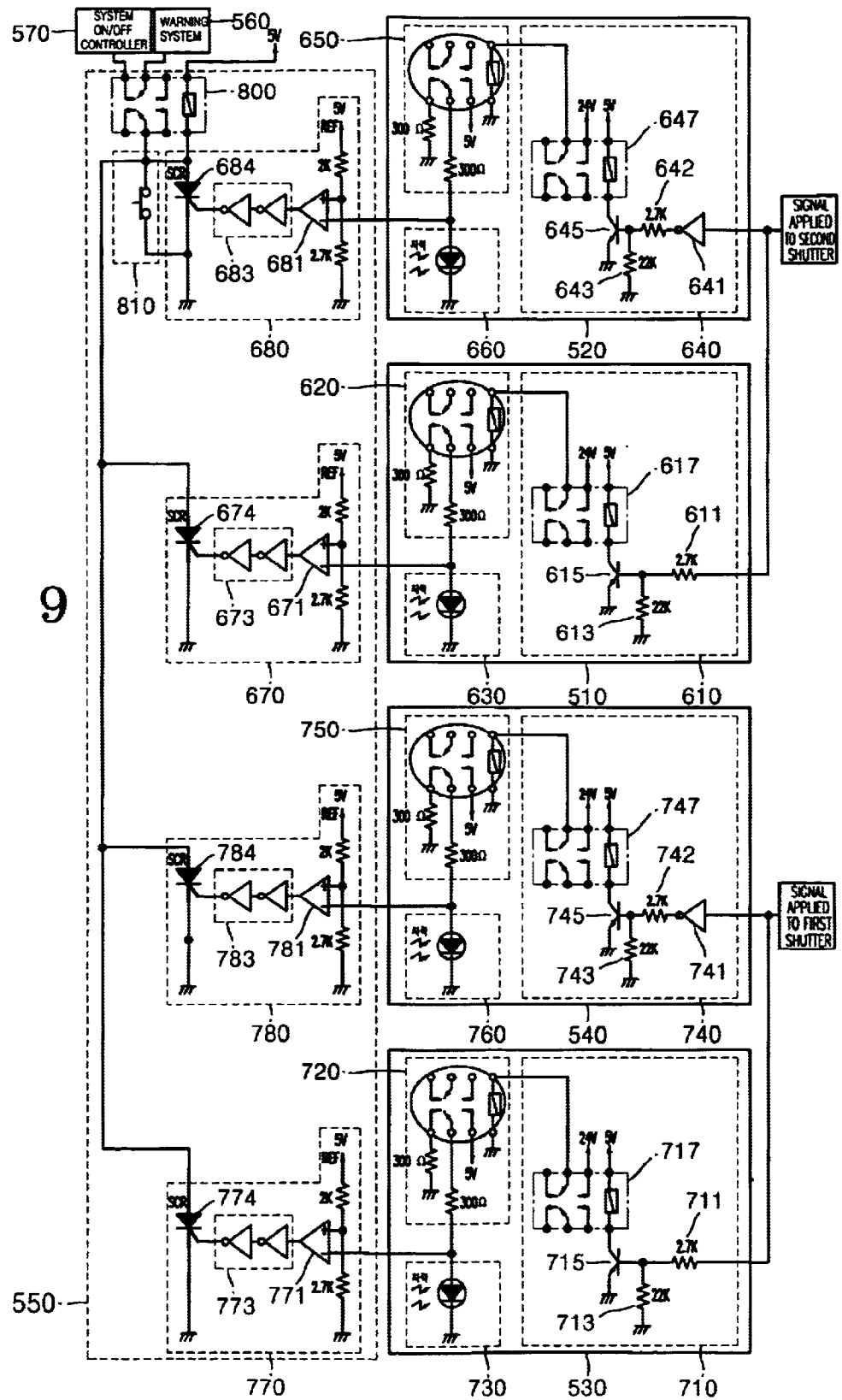
FIG. 9 is a circuit diagram of the exposure system of FIG. 7, according to an embodiment of the present invention.

FIG. 9 is a circuit diagram of the exposure system of FIG. 7. The first sensing circuit 510 (which detects the extent of the closed state of the first shutter 410) comprises a first input circuit 610 for receiving an input signal for opening or closing the first shutter 410, a first timer 620 for delaying the input signal by a predetermined time, and a first sensor 630 for sensing a circumferential magnetic field in response to the delayed signal output from the first timer 620.

The first input circuit 610 comprises first and second resistors 611 and 613 for attenuating a voltage of the input signal to a level of a reference voltage, and switching elements that is selectively activated in response to the attenuated signal. The switching elements, for example, comprise a bipolar transistor 615 and a relay 617 that is activated in response to the activation of the bipolar transistor 615.

The first timer 620 receives the signal output from the first input circuit 610, that is, from the relay 617 of the first input circuit 610, and outputs the signal after a predetermined time is lapsed. The first timer 620 has the same function as the first timer 230 of FIG. 5.

The first sensor 630 senses the circumferential magnetic field, that is, the position of the first magnet 415a of the first cylinder 415 in response to the signal outputted from the first timer 620. The first sensor 630 comprises a diode. When the first sensor 630 senses the magnetic field in response to the signal outputted from the first timer 620, the diode outputs a turn-on voltage. However, when the first sensor 630 does not sense the magnetic field, the first sensor 630, i.e., the diode is turned off. The second sensing circuit 520 comprises a second input circuit 640 for receiving an input signal for opening or closing the first shutter 410, a second timer 650 for delaying the input signal by a predetermined time, and a second sensor 660 for sensing a circumferential magnetic field in response to the input signal outputted from the second timer 650.

The second input circuit 640 comprises an inverter 641 for inverting the input signal for opening or closing the first shutter 410, first and second resistors 642 and 643 for attenuating the signal outputted from the inverter 641 to a predetermined voltage, and switching elements that is selectively activated in response to the attenuated signal. The switching elements, for example, comprise a bipolar transistor 645 and a relay 647 in which the relay 647 activates in response to the activation of the bipolar transistor 645. The input signal applied to the second input circuit 640 is the same as the input signal applied to the first input circuit 610.

The second timer 650 delays the input signal by a predetermined time. The second sensor 660 senses the circumferential magnetic field, that is, the position of the first magnet 415a of the first cylinder 415a in response to the input signal outputted from the second timer 650.

Similar to the first sensing circuit 510, the third sensing circuit 530 for detecting the extent of the closed state of the second shutter 420 comprises a third input circuit 710, a third timer 720 and a third sensor 730. The third input circuit 710 comprises first and second resistors 711 and 713 for dropping a voltage of an input signal, a bipolar transistor 715, and a relay 717.

Similar to the second sensing circuit 520, the fourth sensing circuit 540 for detecting the extent of an opened state of the second shutter 420 comprises a fourth input circuit 740, a fourth timer 750, and a fourth sensor 760. The fourth input circuit 740 comprises an inverter 741, first and second resistors 742 and 743 for dropping a voltage of an input signal, a bipolar transistor 745, and a relay 747. The same signal is applied to the third and fourth sensing circuits 530 and 540.

The controller 550 comprises a first circuit 670 for processing the signal sensed by the first sensing circuit 510, a second circuit 680 for processing the signal sensed by the second sensing circuit 520, a third circuit 770 for processing the signal sensed by the third sensing circuit 530, and a fourth circuit 780 for processing the signal sensed by the fourth sensing circuit 540. The controller 550 further comprises an output circuit 800 for selectively outputting a control signal to the warning system 560 and the system on/off controller 570, based on the signals of the first through fourth circuits 670, 680, 770, and 780, and a reset circuit 810 for initializing the first through fourth circuits 670, 680, 770, and 780.

The first through fourth circuits 670, 680, 770, and 780 have the same structures. The first through fourth circuits 670, 680, 770, and 780 comprise amplifiers 671, 681, 771, and 781 for comparing the signals outputted from the first through fourth sensing circuits 510, 520, 530, and 540 with a reference voltage REF, and for amplifying the compared signals, buffers 673, 683, 773, and 783 for buffering the amplified signals outputted from the amplifiers 671, 681, 771, and 781, and SCRs 674, 684, 774, and 784 selectively operated according to the output signals of the buffers 673, 683, 773, and 783, respectively.

Each of the amplifiers 671, 681, 771, and 781 comprises an operational amplifier (OP amp) which compares the output voltage of each of the first through fourth sensors 630, 660, 730, and 740 with the reference voltage REF. The operational amplifier outputs a "low" signal when the output voltage is less than the reference voltage REF, and outputs a "high" signal when the output voltage is greater than the reference voltage REF.

The buffers 673, 683, 773, and 783, buffering the signals outputted from the amplifiers 671, 681, 771, and 781, may comprise a plurality of serial inverters.

Each of the SCRs 674, 684, 774, and 784 is turned on in response to a "high" signal of corresponding one of the buffers 673, 683, 773, and 783. As described above, the SCR may be used as a switching element to hold the output signal of the buffer until a next signal is applied to the SCR.

The output circuit 800 comprises a relay and outputs a control signal to the warning system 560 and the system on/off controller 570 in response to the turn-on of one of the SCRs 674, 684, 774, and 784. The reset circuit 810 resets the SCRs 674, 684, 774, and 784.

Figure 10:
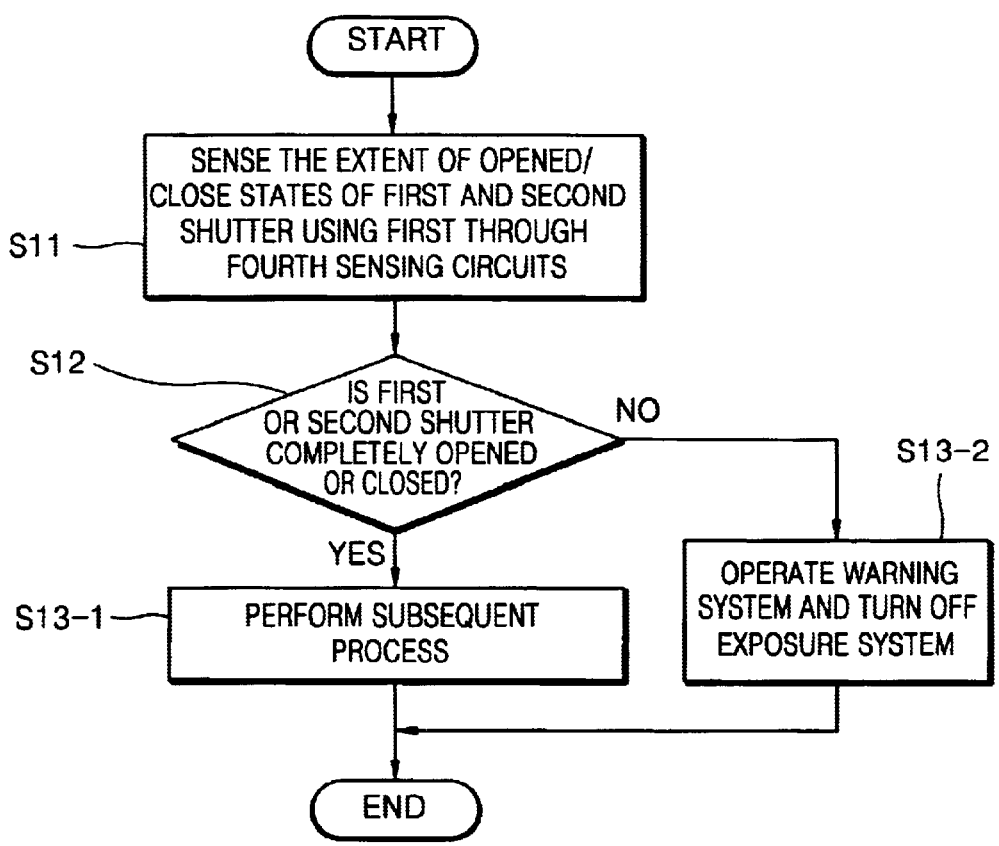
FIG. 10 is a flow chart illustrating a preferred mode of operation of the exposure system of FIG. 7.

FIG. 10 is a flow chart illustrating the operations of the exposure system of FIG. 7.

The extent of the open/closed states of the first and second shutters 410 and 420 is sensed by the first through fourth sensing circuits 510, 520, 530, and 540 (S11). For instance, the extent of the opened/closed states of the first and second shutters 410 and 420 is sensed by the first through fourth sensing circuits 510, 520, 530, and 540 in response to the signals for exposing or shutting a light source. The light source is exposed when the first shutter 410 is completely closed and the second shutter 420 is completely opened. Since the first shutter 410 is driven (is opened) only when the light source is rapidly shut, the first shutter 410 is not driven (is closed) when the light source should be exposed. Since the second shutter 420 actually exposes or shuts the light source, the second shutter 420 is opened when the light source should be exposed, and the second shutter 420 is closed when the light source should be shut.

A "high" signal (that is for closing the first shutter 410) is applied to the first and second sensing circuits 510 and 520, and a "low" signal (that is for opening the second shutter 420) is applied to the third and fourth sensing circuits 530 and 540.

When the "high" signal is applied to the first input circuit 610 of the first sensing circuit 510, the bipolar transistor 615 is activated. In response to the activation of the bipolar transistor 615, the relay 617 operates, and the "high" signal is applied to the first timer 620. The first timer 620 outputs the "high" signal to the first sensor 630 of the first sensing circuit 510 after a predetermined time is lapsed.

Because the "high" signal is inverted by the inverter 641 of the second sensing circuit 520 and is applied to the bipolar transistor 645, the bipolar transistor is turned off, and the second sensing circuit 520 does not activated. Since the first shutter 410 is closed, the second sensing circuit 520 does not operate.

Meanwhile, a "low" signal is applied to the third and fourth input circuits 710 and 740 of the third and fourth sensing circuits 530 and 540 to open the second shutter 420. Because a "low" signal is applied to the third input circuit 710 of the third sensing part 530, the bipolar transistor 715 is inactivated, and the third sensing circuit 530 is not activated. Since the second shutter 420 is opened, the third sensing circuit 530 does not operate.

Because the "low" signal is inverted by the inverter 741 and the inverted signal, that is, a "high" signal is applied to the fourth input circuit 740 of the fourth sensing circuit 540, the bipolar transistor 745 is activated, and the relay 747 activates. In response to the activation of the relay 747, the fourth timer 750 operates. The fourth timer 750 outputs the "high" signal outputted from the relay 747 to the fourth sensor 760 of the fourth sensing circuit 540 after a predetermined time is lapsed. The fourth sensor 760 senses a magnetic field in response to the "high" signal output from the fourth timer 750.

When the "high" signal for driving the second shutter 420 is applied to the second cylinder 425 of the second shutter 420, the second magnet 425a at one end of the second cylinder 425 moves, and thus, the second cylinder 425 operates. As described above, the fourth timer 750 delays the "high" signal by a time for completely opening or closing the second shutter 420.

It is determined whether the first shutter 410 is completely closed and the second shutter 420 is completely opened in response to the output signals of the first sensing circuit 510 and the fourth sensing circuit 540 (S12). For instance, because the first and fourth sensors 630 and 760 comprise diodes, the diodes of the first and fourth sensors 630 and 760 are turned on in response to the voltages outputted from the first and fourth timers 620 and 750. That is, if the first and fourth sensors 630 and 760 sense the magnetic fields, the diodes output turn-on voltages to the first and fourth circuits 670 and 780. However, if the sensors 630 and 760 does not sense the magnetic fields, the diodes are turned off, and thus the outputs of the first and fourth timer 620 and 750 are outputted to the first and fourth circuit 670 and 780.

The first and fourth circuits 670 and 780 compare the output signals (that is, the output signals of the first and fourth sensors 630 and 760) of the first and fourth sensing circuits 510 and 540, with a reference voltage REF. For example, the output voltages of the first and fourth sensors 630 and 760 are applied to the positive input terminals of the amplifiers 671 and 781 of the first and fourth circuits 670 and 780, and the reference voltage REF is applied to the negative input terminals of the amplifiers 671 and 781. When the first and fourth sensors 630 and 760 sense the magnetic fields, the turn-on voltages of the diodes are less than the reference voltage REF, and thus each of the amplifiers 671 and 781 outputs a "low" signal. The output signals of the amplifiers 671 and 781 are applied to the SCRs 674 and 784 through the buffers 673 and 783. Since the signals outputted from the buffers 673 and 783 are "low", the SCRs 674 and 784 are inactivated. Thus, the output circuit 800, comprising a relay, does not operate. As a result, it is determined that the first shutter 410 is completely closed and the second shutter 420 is completely opened, and a subsequent process is performed (S13-1).

When each of the first and fourth sensors 630 and 760 does not sense the magnetic field, both the output signals of the first and fourth timers 620 and 750 and the reference voltage REF are "high", and the amplifiers 671 and 781 also output "high" signals. The output signals of the amplifiers 671 and 781 are buffered by the buffers 673 and 783 and are applied to the SCRs 674 and 784. Since the signals outputted from the buffers 673 and 783 are "high", the SCRs 674 and 784 are activated, and the output circuit 800 operates. The output circuit 800 outputs a control signal to the warning system 560 and the system on/off controller 570.

The non-sensing of the magnetic fields by the sensors 630 and 760 indicates that the first and second cylinders 415 and 425 are not located at proper positions and thus the first and second shutters 410 and 420 are not completely closed or opened. Thus, the controller 550 outputs a control signal to the warning system 560 and the system on/off potion 570 to inform a user that the first and second shutters 410 and 420 are improperly operating. As a result, the exposure system is turned off to stop a subsequent process, and an occurrence of an error will be prevented (S13-2).

Meanwhile, it is checked whether the light source is completely closed by the first and second shutters 410 and 420 when the first through fourth sensing circuits 510, 520, 530, and 540 receive the signals for closing the light signal (S11). When the second shutter 420 is closed and the first shutter 410 is opened, or when both the first and second shutters 410 and 420 are closed, the light source is closed.

A "low" signal (that is for opening the first shutter 410) is applied to the first and second sensing circuits 510 and 520, and a "high" signal (that is for closing the second shutter 420) is applied to the third and fourth sensing circuits 530 and 540.

Since the bipolar transistor 615 of the first input circuit 610 is inactivated in response to the "low" signal, the first sensing circuit 510 does not operate. Since the first shutter 410 is operating (opened), the first sensing circuit 510 does not operate.

On the other hand, because the "low" signal is inverted by the inverter 641 and is applied to the bipolar transistor 645, the relay 647 operates, and thus, the second timer 650 operates. The second timer 650 outputs the "high" signal to the second sensor 660 of the second sensing circuit 520, after a predetermined time is lapsed. The first cylinder 415 of the first shutter 410 is operated by the signal applied to the first shutter 410, and thus, the first magnet 415a at one end of the first cylinder 415 begins to move. As described above, the second timer 650 delays the "high" signal by a time for completely opening/closing the first shutter 410. After that, the second sensor 660 of the second sensing circuit 520 senses the circumferential magnetic field.

Meanwhile, a "high" signal is applied to the third and fourth input circuits 710 and 740 of the third and fourth sensing circuits 530 and 540 to close the second shutter 420.

Since a "high" signal is applied to the third input circuit 710 of the third sensing circuit 530, the bipolar transistor 715 is activated, and thus the relay 7171 is activated. According to the activation of the relay 717, the third timer 720 operates. The third timer 720 outputs the "high" signal to the third sensor 730 of the third sensing circuit 530 after a predetermined time is lapsed. The third sensor 730 senses the magnetic field.

Since the "high" signal is inverted by the inverter 741 of the fourth input circuit 740 of the fourth sensing circuit 540, the bipolar transistor 745 is inactivated, and the fourth sensing circuit 540 does not operate. Since the second shutter 420 is closed, the fourth sensing circuit 540 does not operate.

By the output signals of the second sensing circuit 520 and the third sensing circuit 530, it is determined whether the first shutter 410 is completely opened and the second shutter 420 is completely closed (S12). The second sensor 660 of the second sensing circuit 520 and the third sensor 730 of the third sensing circuit 530 comprise diodes. When the second and third sensors 660 and 730 sense the magnetic fields in response to the voltages outputted from the second and third timers 650 and 720, the diodes of the sensors 660 and 730 are activated and output the turn-on voltage of the diodes. When the sensors 660 and 730 do not sense the magnetic fields, the diodes are inactivated and outputs the voltages outputted from the second timer 650 and the third timer 720.

The second circuit 680 compares the output signal (that is, the output signal of the second sensor 660) of the second sensing circuit 520 with a reference voltage REF. For instance, the output voltages of the second and third sensors 660 and 730 are applied to the positive input terminals of the amplifiers 681 and 771 of the second and third circuits 680 and 770, and the reference voltage REF is applied to the negative input terminals of the amplifiers 681 and 771.

When the second and third sensors 660 and 730 sense the magnetic fields, the turn-on voltages of the diodes are less than the reference voltage REF, and thus each of the amplifiers 681 and 771 outputs a "low" signal. The output signals of the amplifiers 681 and 771 are applied to the SCRs 684 and 774 through the buffers 683 and 773. Since the signals outputted from the buffers 683 and 773 are "low", the SCRs 684 and 774 are inactivated. Thus, the output circuit 800, comprising a relay, does not operate. As a result, it is determined that the first shutter 410 is normally operated (opened) and the second shutter 420 is completely closed, and a subsequent process is performed (S13-1).

When the second and third sensors 660 and 730 do not sense the magnetic fields, the output signals of the second and third timers 650 and 720 and the reference voltage REF are "high", and the amplifiers 681 and 771 also output a "high" signal. The output signals of the amplifiers 681 and 771 are buffered by the buffers 683 and 773 and are applied to the SCRs 684 and 774. Since the signals outputted from the buffers 683 and 773 are "high", the SCRs 684 and 774 are activated, and the output circuit 800, comprising a relay, operates.

As a result, the output circuit 800 outputs a control signal to the warning system 560 and the system on/off controller 570. The non-sensing of the second and third sensors 660 and 730 indicates that the first and second cylinders 415 and 425 are not located at proper positions, and thus the first and second shutters 410 and 420 are not completely closed or opened. Thus, the controller 550 outputs a control signal to the warning system 560 and the system on/off potion 570 to inform a user that the first and second shutters 410 and 420 do not operate normally. As a result, the exposure system is turned off to stop a subsequent process, thereby preventing an occurrence of errors.

Advantageously, an exposure system according to embodiments of the present invention comprises at least two sensing circuits for detecting whether shutters for opening or closing a light source are completely opened or closed. The exposure system operates a warning system to turn off the system when the shutters are not completely opened or closed. Thus, defects are prevented in a photolithographic process.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An exposure system of a semiconductor wafer, comprising:
    first and second shutters for opening or closing a light source;
    a first sensing circuit for sensing a position of the first shutter and for generating a first sensed signal;
    a second sensing circuit for sensing a position of the second shutter and for generating a second sensed signal; and
    a controller for determining whether the first and second shutters are completely opened in response to the first and second sensed signals and for generating a control signal when either the first shutter or the second shutter is not completely opened.

2. The system of claim 1, further comprising a warning system for generating a warning signal to inform a user that either the first shutter or the second shutter is not completely opened in response to the control signal.

3. The system of claim 1, further comprising a system on/off controller for turning off the exposure system in response to the control signal.

4. The system of claim 1, further comprising first and second cylinders for respectively driving the first and second shutters, the first and second cylinders respectively comprising magnets that move during operation of the first and second cylinders.

5. The system of claim 4, wherein the first and second sensing circuits sense magnetic fields generated by the magnets of the first and second cylinders.

6. The system of claim 4, wherein the first sensing circuit comprises:
    an input circuit for receiving a signal for opening or closing the first shutter;
    a timer for delaying the signal by a predetermined time; and
    a sensor for sensing a circumferential magnetic field generated by the magnet of the first cylinder in response to the delayed signal outputted from the timer, and for generating the first sensed signal.

7. The system of claim 6, wherein the input circuit comprises:
    a switching element that is selectively activated in response to the signal for opening or closing the first shutter; and
    a relay that is activated in response to the activation of the switching element.

8. The system of claim 6, wherein the sensor comprises a diode for sensing the magnetic field generated by the magnet of the first cylinder.

9. The system of claim 4, wherein the second sensing circuit comprises:
    an input circuit for receiving a signal for opening or closing the second shutter;
    a timer for delaying the signal by a predetermined time; and
    a sensor for sensing a circumferential magnetic field generated by the magnet of the second cylinder in response to the delayed signal outputted from the timer, and for generating the second sensed signal.

10. The system of claim 9, wherein the input circuit comprises:
    an inverter for inverting the signal for opening or closing the second shutter;
    a switching element that is selectively activated in response to the inverted signal; and
    a relay that is activated in response to the activation of the switching element.

11. The system of claim 9, wherein the sensor comprises a diode for sensing the magnetic field generated by the magnet of the second cylinder.

12. The system of claim 1, wherein the controller comprises:
    a first circuit for processing the first sensed signal of the first sensing circuit;
    a second circuit for processing the second sensed signal of the second sensing circuit; and
    an output circuit for outputting the control signal based on the results of processing the first and second sensed signals.

13. The system of claim 12, wherein the controller further comprises a reset circuit for initializing the first and second circuits.

14. The system of claim 12, wherein each of the first and second circuits comprises:
    an amplifier for comparing one of the first and second sensing signals with a reference voltage and for amplifying the compared signal;
    a buffer for buffering the amplified signal outputted from the amplifier; and
    a silicon controlled rectifier (SCR) that is selectively activated in response to the buffered signal outputted from the buffer, wherein the SCR is activated when a voltage level of the one of the first and second sensing signals is greater than a voltage level of the reference voltage.

15. The system of claim 14, wherein the output circuit comprises a relay for outputting the control signal when one of the SCRs of the first and second circuits is activated.

16. A method for operating an exposure system of a semiconductor wafer, the exposure system comprising first and second shutters for closing or opening a light source and first and second cylinders for driving the first and second shutters, the first and second cylinders comprising magnets, the method comprising the steps of:
    sensing positions of the first and second shutters and generating first and second sensed signals;
    determining whether the first and second shutters are completely opened, in response to the first and second sensed signals; and
    performing a warning operation when the first and second shutters are not completely opened, thereby turning off the exposure system.

17. The method of claim 16, further comprising the step of exposing the light source by completely opening the first and second shutters.

18. The method of claim 16, wherein the step of sensing the positions of the first and second shutters comprises the steps of:
    receiving an input signal for closing or opening the first and second shutters;
    delaying the input signal during the movements of the magnets of the first and second cylinders, wherein the movements are generated in response to the input signal; and
    sensing magnetic fields generated by the movements of the magnets of the first and second cylinders to generate the first and second sensed signals.

19. The method of claim 16, wherein the step of determining whether the first and second shutters are completely opened comprises the steps of:
comparing each of the first and second sensed signals with a reference signal; and
generating a control signal when the voltage level of each of the first and second sensed signals is greater than the voltage level of the reference signal, wherein the exposure system performs the warning operation in response to the control signal.

20. An exposure system of a semiconductor wafer, comprising:
first and second shutters for selectively opening or closing a light source
a first sensing circuit for sensing the extent of a closed state of the first shutter and for generating a first sensed signal;
a second sensing circuit for sensing the extent of an opened state of the first shutter and for generating a second sensed signal;
a third sensing circuit for sensing the extent of a closed state of a second shutter and for generating a third sensed signal;
a fourth sensing circuit for sensing the extent of an opened state of the second shutter and for generating a fourth sensed signal; and
a controller for determining whether the first and second shutters are completely opened or closed, in response to the first through the fourth sensed signals and for generating a control signal when either the first shutter or the second shutter is not completely opened or closed.

21. The system of claim 20, further comprising a warning system for generating a warning signal to inform a user that either the first shutter or the second shutter is not completely opened or closed in response to the control signal.

22. The system of claim 20, further comprising a system on/off controller for turning off the exposure system in response to the control signal.

23. The system of claim 20, further comprising first and second cylinders for respectively driving the first and second shutters, the first and second cylinders each comprising magnets that move during operation of the first and second cylinders, respectively.

24. The system of claim 23, wherein the first through the fourth sensing circuits sense magnetic fields generated by the magnets of the first and second cylinders.

25. The system of claim 23, wherein each of the first and third sensing circuits comprises:
an input circuit for receiving an input signal for opening or closing the first or second shutter;
a timer for delaying the input signal by a predetermined time; and
a sensor for sensing a circumferential magnetic field generated by the magnet of the first or second cylinder in response to the delayed signal outputted from the timer.

26. The system of claim 25, wherein the predetermined time is a time for allowing the magnet of the first or second cylinder to move from one end of the first or second cylinder to the other end of the first or second cylinder.

27. The system of claim 25, wherein the input circuit comprises:
a switching element that is selectively activated in response to the input signal; and
a relay that is activated in response to the activation of the switching element.

28. The system of claim 25, wherein the sensor comprises a diode for sensing the magnetic field generated by the magnet of the first or second cylinder.

29. The system of claim 23, wherein each of the second and fourth sensing circuits comprises:
an input circuit for receiving an input signal for opening or closing the first or second shutter;
a timer for delaying the input signal by a predetermined time; and
a sensor for sensing a circumferential magnetic field generated by the magnet of the first or second cylinder in response to the delayed signal outputted from the timer.

30. The system of claim 29, wherein the input circuit comprises:
an inverter for inverting the input signal;
a switching element that is selectively activated in response to the inverted signal; and
a relay that is activated in response to the activation of the switching element.

31. The system of claim 29, wherein the sensor comprises a diode for sensing the magnetic field generated by the magnet of the first or second cylinder.

32. The system of claim 29, wherein the predetermined time is a time for allowing the magnet of the first or second cylinder to move from one end of the first or second cylinder to the other end of the first or second cylinder.

33. The system of claim 20, wherein the controller comprises:
a first circuit for processing the first sensed signal of the first sensing circuit;
a second circuit for processing the second sensed signal of the second sensing circuit;
a third circuit for processing the third sensed signal of the third sensing circuit;
a fourth circuit for processing the fourth sensed signal of the fourth sensing circuit; and
an output circuit for outputting the control signal according to the first through fourth sensed signals.

34. The system of claim 33, wherein the controller further comprises a reset circuit for initializing the first through the fourth circuits.

35. The system of claim 33, wherein the first through fourth circuits each comprise:
an amplifier for comparing one of the first through fourth sensing signals with a reference voltage and for amplifying the compared signal;
a buffer for buffering the amplified signal outputted from the amplifier; and
a silicon controlled rectifier (SCR) that is selectively activated in response to the buffered signal outputted from the buffer, wherein the SCR is activated when a voltage level of the one of the first through fourth sensing signals is greater than a voltage level of the reference voltage.

36. The system of claim 35, wherein the output circuit comprises a relay for outputting the control signal when one of the SCRs of the first through fourth circuits is activated.

37. A method for operating an exposure system of a semiconductor wafer, the exposure system comprising first and second shutters for closing or opening a light source and first and second cylinders for driving the first and second shutters, the first and second cylinders comprising magnets, the method comprising the steps of:

sensing the extent of a closed state of the first shutter to generate a first sensed signal;

sensing the extent of an opened state of the first shutter to generate a second sensed signal;

sensing the extent of a closed state of the second shutter to generate a third sensed signal;

sensing the extent of an opened state of the second shutters to generate a fourth sensed signal;

determining whether the first and second shutters are completely opened, in response to the first through fourth sensed signals; and performing a warning operation when the first and second shutters are not completely opened or closed, thereby turning off the exposure system.

38. The method of claim 37, wherein each of the steps of sensing the extent of the closed/opened states of the first/second shutters comprises the steps of:

receiving an input signal for closing or opening the light source;

delaying the input signal during the movement of the magnet of the first or second cylinder, wherein the movement is generated in response to the input signal;

sensing a magnetic field generated by the movement of the magnet of the first or second cylinder to generate each of the first through fourth sensed signals.

39. The method of claim 38, wherein the step of determining whether the first and second shutters are completely opened comprises the steps of:

comparing each of the first through fourth sensed signals with a reference signal;

generating a control signal when the voltage level of each of the first through fourth sensed signals is greater than the voltage level of the reference signal, wherein the exposure system performs the warning operation in response to the control signal;

exposing the light source when the voltage levels of the second and fourth sensed signals are less than the voltage level of the reference signal; and closing the light source when the voltage levels of the first and third sensed signals are less than the voltage level of the reference signal.

* * * * *